US006635541B1

(12) United States Patent
Talwar et al.

(10) Patent No.: US 6,635,541 B1
(45) Date of Patent: *Oct. 21, 2003

(54) METHOD FOR ANNEALING USING PARTIAL ABSORBER LAYER EXPOSED TO RADIANT ENERGY AND ARTICLE MADE WITH PARTIAL ABSORBER LAYER

(75) Inventors: Somit Talwar, Palo Alto, CA (US); Yun Wang, San Jose, CA (US); Carol Gelatos, Redwood City, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/659,102

(22) Filed: Sep. 11, 2000

(51) Int. Cl.$^7$ .............................................. H01L 21/331
(52) U.S. Cl. ...................... 438/308; 438/795; 438/952
(58) Field of Search ................................ 438/308, 795, 438/952

(56) References Cited

U.S. PATENT DOCUMENTS

| 5,523,262 A | * | 6/1996 | Fair et al. ..................... 438/530 |
| 5,612,235 A | * | 3/1997 | Wu et al. ..................... 438/158 |
| 5,956,603 A | | 9/1999 | Talwar et al. ................. 438/520 |
| 6,090,677 A | * | 7/2000 | Burke et al. .................. 438/308 |
| 6,287,927 B1 | * | 9/2001 | Burke et al. .................. 438/308 |
| 6,300,208 B1 | * | 10/2001 | Talwar et al. ................. 438/301 |

* cited by examiner

Primary Examiner—John F. Niebling
Assistant Examiner—Stacy Whitmore
(74) Attorney, Agent, or Firm—Allston L. Jones

(57) ABSTRACT

A method of the invention comprises forming a partial absorber layer (PAL) over at least one integrated transistor device formed on a semiconductor substrate, and exposing the PAL to radiant energy. A first portion of the radiant energy passes through the PAL and is absorbed in the source and drain regions adjacent a gate region of the integrated transistor device and in the semiconductor substrate underneath the field isolation regions of the integrated device. A second portion of the radiant energy is absorbed by the PAL and is thermally conducted from the PAL to the source and drain regions. The first and second portions of the radiant energy are sufficient to melt the source and drain regions to anneal the junctions of the integrated device. The first portion of radiant energy traveling to the substrate underneath the field isolation regions is insufficient in fluence to melt the substrate, and the second portion of radiant energy absorbed by PAL over the field isolation regions is insufficient to cause ablation or surface damage. Accordingly, the source and drain regions can be melted for annealing without overheating the PAL overlying or the substrate beneath the field isolation regions. The invention also includes an article including an integrated device made with a PAL.

22 Claims, 6 Drawing Sheets

METHOD FOR ANNEALING USING PARTIAL ABSORBER LAYER EXPOSED TO RADIANT ENERGY AND ARTICLE MADE WITH PARTIAL ABSORBER LAYER

BACKGROUND OF THE INVENTION

1. Field of the Invention

This invention is directed to a method for annealing a substrate with radiant energy using a partial absorber layer. The invention is also directed to an integrated device(s) or circuit(s) made by such method. The substrate can be composed of silicon, gallium arsenide, or other semiconductor species, or can include an insulative material with a relatively thin-film of semiconductor material formed thereon. The method can be used to anneal or activate an integrated device(s) or circuit(s) formed in the substrate. Such integrated devices can include active devices such as transistors or diodes, or passive devices such as resistors or capacitors. For example, the apparatus and method can be used to anneal a substrate to obtain a relatively high crystalline state therein, or to activate the substrate to incorporate dopant atoms into the substrate's crystalline lattice, to achieve proper electrical performance of the integrated device(s).

2. Description of the Related Art

The ongoing reduction in scale of integrated devices formed in semiconductor substrates requires relatively shallow source/drain junctions for proper electrical performance. Laser thermal processing (LTP), which melts and re-solidifies a thin surface layer of semiconductor substrate using a pulsed laser radiation, is a promising technology for annealing shallow junctions. However, two issues must be resolved for successful integration of LTP into a process for forming integrated devices. First, the gate must be prevented from deforming upon treatment with radiant energy. Second, due to interference effects with radiant energy, the heating of the substrate underneath the field isolation regions can be greater than the heating in the source/drain regions. Such interference effects can lead to undesirable melting of the substrate beneath the field isolation regions. It would be desirable to overcome, these problems to permit effective use of LTP to anneal integrated device(s) formed in a substrate. In U.S. Pat. No. 5,956,603 issued Sep. 21, 1999 to Somit Talwar, et al., a full absorber approach was disclosed where a highly radiation-absorbent layer was deposited on top of the integrated device(s). This absorber layer blocks the radiation from traveling through the field isolation regions, and also preserves the gate physical integrity. A new problem arises with the introduction of a full absorber layer due to differential thermal properties at different regions of integrated device(s). The thermal conductivity of silicon dioxide, which is the common material for field isolation, is significantly lower than that of silicon substrate. As a result, the absorber layer is much hotter in temperature over field isolation regions than over source/drain regions. In fact, the surface temperature of the absorber in field isolation regions can even exceed the melting temperature of the absorber material, leading to undesirable surface damage or ablation.

SUMMARY OF THE INVENTION

The present invention methods and apparatus overcome the above-stated problems to permit effective use of radiant energy to anneal integrated device(s) formed in a substrate. A method of the invention comprises forming a partial absorber layer (PAL) over at least one integrated transistor device formed on a semiconductor substrate. The method also comprises exposing the PAL to radiant energy. The radiant energy can include a first portion that passes through the PAL and is absorbed in the source and drain regions adjacent a gate region of the integrated transistor device. The first portion of radiant energy can also be absorbed in the semiconductor substrate underneath the field isolation regions of the integrated device. The radiant energy can also include a second portion of radiant energy that is absorbed by the PAL and is thermally conducted from the PAL to the source and drain regions. The first and second portions of the radiant energy can be of sufficient energy to melt the source and drain regions to anneal the junctions of the integrated device. The PAL can be formed so that the first portion of radiant energy traveling to the substrate underneath the field isolation regions is sufficiently reduced in fluence to prevent melting of the substrate. The PAL can also be formed so that the second portion of radiant energy absorbed by the PAL over the field isolation regions is of insufficient energy to cause ablation or surface damage to the PAL. Accordingly, the source and drain junction regions can be melted for annealing without overheating the PAL or the substrate beneath the field isolation regions.

The material composing the PAL can be selected to be compatible with an integrated circuit manufacturing environment. It can be composed of at least one of titanium (Ti), titanium nitride (TiN), tantalum (Ta), and/or tantalum nitride (TaN). Alternatively, the PAL can be composed of doped spin-on glass. The PAL can be, formed with a stress of less than $5 \ e^9$ dynes per square centimeter to ensure that it will not crack or adversely impact a gate region of the integrated transistor device. The thickness of the PAL can be between one-hundredth (0.01) to three (3) times the optical absorption length of the material composing the PAL at the wavelength of radiant energy used for annealing. The radiant energy used in the exposing can be generated from a laser, for example. The radiant energy fluence can be from five-hundredths (0.05) to one (1) Joule per square centimeter at a wavelength from one-hundred fifty-seven (157) to one-thousand sixty-four (1,064) nanometers. The method can also comprise forming a barrier layer over the substrate. The barrier layer can be situated between the substrate and the PAL. The barrier layer can be used to prevent contamination of the substrate by blocking diffusion of material from the PAL into the substrate. The barrier layer can be composed of silicon dioxide ($SiO_2$) and/or silicon nitride ($Si_3N_4$). The barrier layer can be formed using low-temperature oxidation (LTO) or plasma-enhanced chemical vapor deposition (PECVD). The method can also include forming a dielectric layer over the PAL. The dielectric layer reinforces the mechanical strength of PAL under exposure to the radiant energy to preserve the physical integrity of a polysilicon gate layer of the integrated transistor device. This dielectric layer can also be used to add thermal load to the field isolation region so that the surface temperature of PAL in field isolation region can be further reduced to avoid undesirable surface damage or ablation of PAL.

The invention also comprises an article of manufacture including a substrate having an integrated device annealed with radiant energy exposed on a partial absorber layer (PAL) formed on the integrated device. The PAL is situated over a barrier layer that blocks diffusion of atoms from the PAL into the substrate under exposure to radiant energy to prevent contamination of the substrate. The integrated device can be annealed with a dielectric layer formed over the PAL to preserve mechanical strength of the PAL to prevent deformation of a gate layer of the integrated device under exposure to radiant energy. The dielectric layer can also add thermal load over a field isolation region of the integrated device so that the surface temperature of PAL in the field isolation region can be further reduced to avoid undesirable surface damage or ablation of the PAL.

These together with other features and advantages, that will become subsequently apparent, reside in the details of the invented apparatus and method as more fully hereinafter described and claimed, reference being made to the accompanying drawings, forming a part hereof, wherein like numerals refer to like parts throughout the several views.

DESCRIPTION OF THE PREFERRED EMBODIMENTS

Figure 1A:
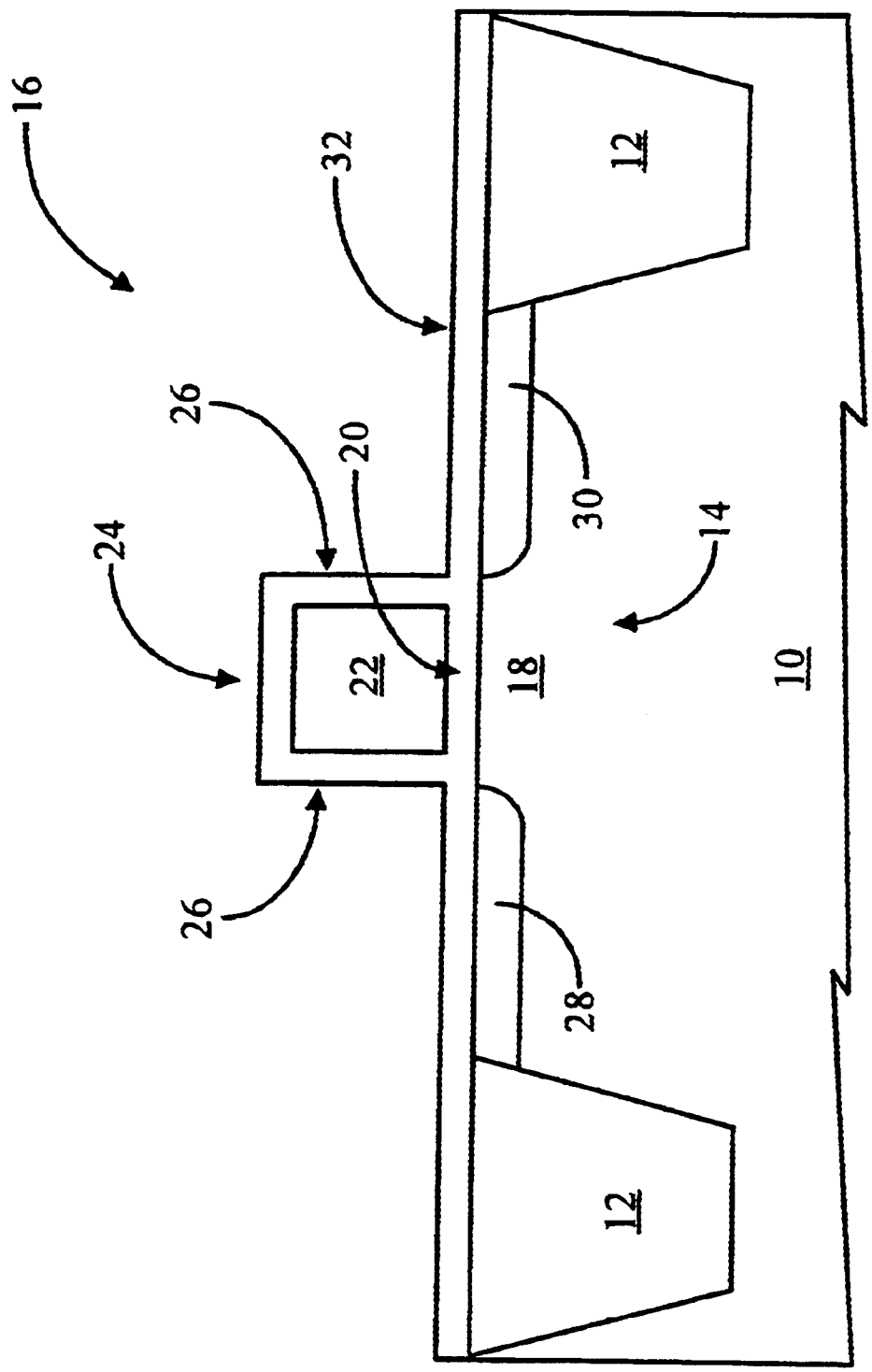
FIGS. 1A–1D are cross-sectional views with which the method of the present invention that is used to anneal source and drain regions of an integrated transistor device formed in a semiconductor substrate is illustrated.

As used here in, the following terms have the following meanings:

"Absorption length" is a well-known parameter, and is defined as the thickness of a particular material required to reduce the intensity of the radiation propagating in such material to 1/e, or 36.8 percent, of its initial intensity.

"Anneal" includes "activation", "crystallization" or "recrystallization" within its scope, and refers to raising and subsequently lowering the temperature of a relatively disordered semiconductor region either to crystallize such region to be integral with a crystalline semiconductor substrate, or to activate dopant atoms by incorporating them into the crystalline lattice of the semiconductor region.

"Depth" refers to the distance to which a region extends into the substrate in a direction perpendicular to the substrate's upper major surface as viewed in the perspective of the Figures.

"Disordered region" refers to a semiconductor region in which the atoms contained therein are not relatively ordered either because they are in a non-crystalline state due to damage or amorphization caused by implantation of dopant or non-dopant atoms. "Disordered region" can also refer to a portion of a semiconductor substrate in which dopant atoms have not been incorporated into the crystalline lattice of such region by activation, for example.

"Integrated device" can refer to an active device such as a transistor or diode (including bipolar and complementary metal-insulator-semiconductor field-effect transistor (MISFET)), or can refer to a passive device such as a resistor or capacitor. A MISFET includes a complementary metal-oxide field-effect transistor (MOSFET) within its definition.

"Thermal diffusion length" is a well-known parameter, and is defined as the thickness of a particular material required to reduce the thermal energy propagating in such material to 1/e, or 36.8 percent, of its initial value.

"Thickness" refers to the distance between the upper and lower surfaces of a region in a direction perpendicular to such surfaces as viewed in the perspective of the Figures.

1. First Generalized Embodiment of the Invented Method

Methods for annealing source and drain regions of an integrated transistor device are now described with reference to FIGS. 1A–1D. Although not directly related to the invention, a relatively brief description of the manner of forming an integrated device in a substrate follows to provide understanding of context for the invention.

The method is applied to a semiconductor substrate 10. The semiconductor substrate 10 can include silicon (Si), gallium arsenide (GaAs), or other semiconductor material. The substrate 10 can be in the form of a wafer, for example. The wafer can be six, eight, twelve, or sixteen inches in diameter and on the order of seven-hundred-fifty (750) microns in thickness. Alternatively, the substrate 10 can be a layer of semiconductor material formed on an insulative layer or material. For example, the semiconductor substrate 10 could be a layer of silicon in a silicon-on-insulator (SOI) or a silicon-on-sapphire (SOS) structure. The substrate 10 could also be a relatively thin-film of semiconductor material such as poly-silicon or crystalline silicon formed on a transparent insulative substrate as is used in the manufacture of thin-film transistors for flat panel displays and the like. The major surface of the substrate 10 extends in a direction perpendicular to the plane of FIGS. 1A–1D. Such major surface can be oriented in <100> or <111> directions defined by Miller indices, as is well-known to persons of ordinary skill in this technology.

In FIG. 1A, field isolation regions 12 are formed in the substrate 10 to electrically-isolate an active region 14 of the substrate in which an integrated transistor device 16 is to be formed. A resist layer is formed over an active region 16 of the substrate 10. Trenches are etched into the substrate 10 using an acidic bath, for example. The resist layer can be removed using wet or dry etching. The trench areas are subjected to thermal oxidation to form the field isolation regions 12. Chemical vapor deposition (CVD) of silicon dioxide ($SiO_2$) in the trench and/or oxidation of the substrate 10 using low temperature thermal oxidation or the like can be performed to fill the trench with silicon oxide. The field isolation regions 12 extend to a depth sufficient to electrically isolate the active region 14. For example, the field isolation regions 12 extend to a depth from one-hundred (100) to one-thousand (1,000) nanometers (nm) into the substrate 10. Numerous other techniques can be used to form the field isolation regions 12 in the substrate 10. Such techniques for forming field isolation regions 12 are well-known to those of ordinary skill in this technology.

The channel region 18 can be formed in a variety of ways. Dopant atoms can be introduced into the semiconductor material composing the substrate 10 to form the channel region 18. Many wafer substrates are commercially-available with specified concentrations of dopant atoms that may be sufficient to form the channel region 18. Alternatively, dopant atoms can be implanted relatively shallowly into the substrate 10 into the channel region. As yet another alternative, dopant atoms can be to implanted and/or diffused to form a well region (not shown) that includes the channel region 18. The well region can extend from the substrate surface to a depth deeper than the source and drain regions, but shallower than the depth of the field isolation regions 12. Any one or a combination of the above-stated techniques can be used to form the channel region, although other techniques may also be used. If the channel region 18 of the integrated transistor device 16 is to have a p-type channel, n-type dopants are implanted into the substrate 10. If the integrated transistor device is to have an n-type channel, p-type dopants are implanted into the substrate 10. P-type dopant atoms including boron (B), aluminum (Al), gallium (Ga), indium (In). N-type dopant atoms species include arsenic (As), phosphorus (P), antimony (Sb). The dopant atoms can be formed in a concentration from $10^{11}$ to $10^{14}$ atoms per square centimeter, for example.

A gate insulator layer 20 is formed over the active region 14 of the substrate 10. The gate insulator layer 20 can be composed of a substance such as silicon dioxide ($SiO_2$), silicon nitride ($Si_3N_4$), aluminum oxide ($Al_2O_3$), titanium oxide ($TiO_2$), barium strontium titanium oxide ($BaSrTiO_3$), and/or tantalum oxide ($Ta_2O_5$). The gate insulator layer 20 can be formed with a variety of well-known techniques, including oxidation, physical vapor deposition (PVD), remote plasma oxidation, and chemical vapor deposition (CVD). The thickness of the gate insulator layer 20 depends upon scaling of the integrated transistor device 16 to be formed in the method. For example, for integration densities on the order of one micron, the gate insulator layer 20 can be formed with a thickness of many tens to hundreds of nanometers in thickness. For sub-micron integration densities, the thickness of the gate insulator layer 20 can be below thirty (30) nanometers. Optionally, dopants can be implanted into the channel region to adjust the gate threshold voltage of the integrated device. The channel dopants can be implanted through the gate insulator layer 20 using techniques that are well-known in this technology.

In FIG. 1A, a gate conductor layer 22 is formed over the gate insulator layer 20. The gate conductor layer 22 can be formed of polysilicon deposited on the gate insulator layer 20. The polysilicon layer can be formed by chemical vapor deposition (CVD) or plasma-enhanced chemical vapor deposition (PECVD). The gate conductor layer 22 can be formed to a thickness of from ten (10) to three-hundred (300) nanometers, for example. A resist layer is formed over the gate conductor layer 22. Such resists and their use are well-known in this technology. The resist layer is exposed with radiation, developed with a suitable developer substance, and hardened such as by baking in an oven. The gate insulator layer and the gate conductor layer are etched using dry etching to remove such layers in areas not protected by the patterned resist layer. The resist layer used to form the gate region 24 is subsequently stripped in a wet bath. Optionally, an insulator layer can be formed over the gate region 24 to form side walls 26 for the gate region 24.

In FIG. 1A, dopant atoms are implanted into the substrate 10 to form source and drain regions 28, 30, and channel region 18 between the source and drain regions. Such dopant atoms in the source and drain regions 28, 30 are of opposite conductivity type from that of the channel region 18. Therefore, if p-type dopants are implanted in the channel region 18, the source and drain regions 28, 30 are implanted with n-type dopants. Conversely, if the channel region 18 is implanted with n-type dopants, the source and drain regions 28, 30 are implanted with p-type dopants. The depth of the source and drain regions 28, 30 can extend from ten (10) to one-hundred (100) nanometers into the substrate 10. The ion implantation energy can be from one-half (0.5) to one-hundred (100) kiloelectron-volts (KeV) at a dosage from $10^{13}$ to $10^{16}$ atoms per square centimeter. The ion species, implantation energy, and the dosage are selected to produce the source and drain regions to a desired depth within the substrate 10. The ion implantation can be performed with a variety of commercially-available equipment such as the 9500 XR Ion Implanter™ tool from Applied Materials, Inc., Santa Clara, Calif. After implantation, the dopants within the source and drain regions 28, 30 are not generally electrically active. Annealing must be performed to melt the source and drain regions 28, 30 and subsequently allow them to cool so that the dopant atoms are properly situated with respect to the crystalline lattice to generate desired electrical behavior for the integrated device 16.

With the above-described context for the invention, the invented method is now explained with reference to FIGS. 1A–1D. In FIG. 1A, an optional barrier layer 32 is formed over the substrate 10. In cases when there was no appreciable diffusion of impurities, or the diffusion was tolerable, then no barrier layer would be required. The barrier layer 32 serves to block diffusion of impurities from a partial absorber layer (PAL) 34, a main focus of this invention, into the substrate 10. The barrier layer 32 can be formed of silicon dioxide ($SiO_2$), silicon nitride ($Si_3N_4$), aluminum oxide ($Al_2O_3$), titanium oxide ($TiO_2$), barium strontium titanium oxide ($BaSrTiO_3$), and tantalum oxide ($Ta_2O_5$). The barrier layer 32 can be formed to a thickness on the order of tens to hundreds of nanometers, for example. The thickness of the barrier layer 32 can be larger than the metal or impurity diffusion length of the material composing the PAL 34 under exposure to the radiant energy 38. However, the thickness of the barrier layer 32 is preferably much less than thermal diffusion length of the material composing the barrier layer so that no significant temperature drop occurs across the barrier layer, which would adversely affect sufficiency of heat delivered to the source and drain regions 28, 30 for annealing.

An exemplary barrier layer 32 is formed of ten (10) nanometers of silicon oxide ($SiO_2$) deposited using silane-based or TEOS (tetraethylorthosilicate)-based plasma-enhanced chemical vapor deposition (PECVD), as is well-known to persons of ordinary skill in this industry. The deposition temperature is preferably below four-hundred-fifty (450) degrees Celsius. Thickness of the barrier layer 32 can be measured with a tool such as the Nanospec 800™ series from Nanometrics, Inc., Sunnyvale, Calif.

Figure 1B:
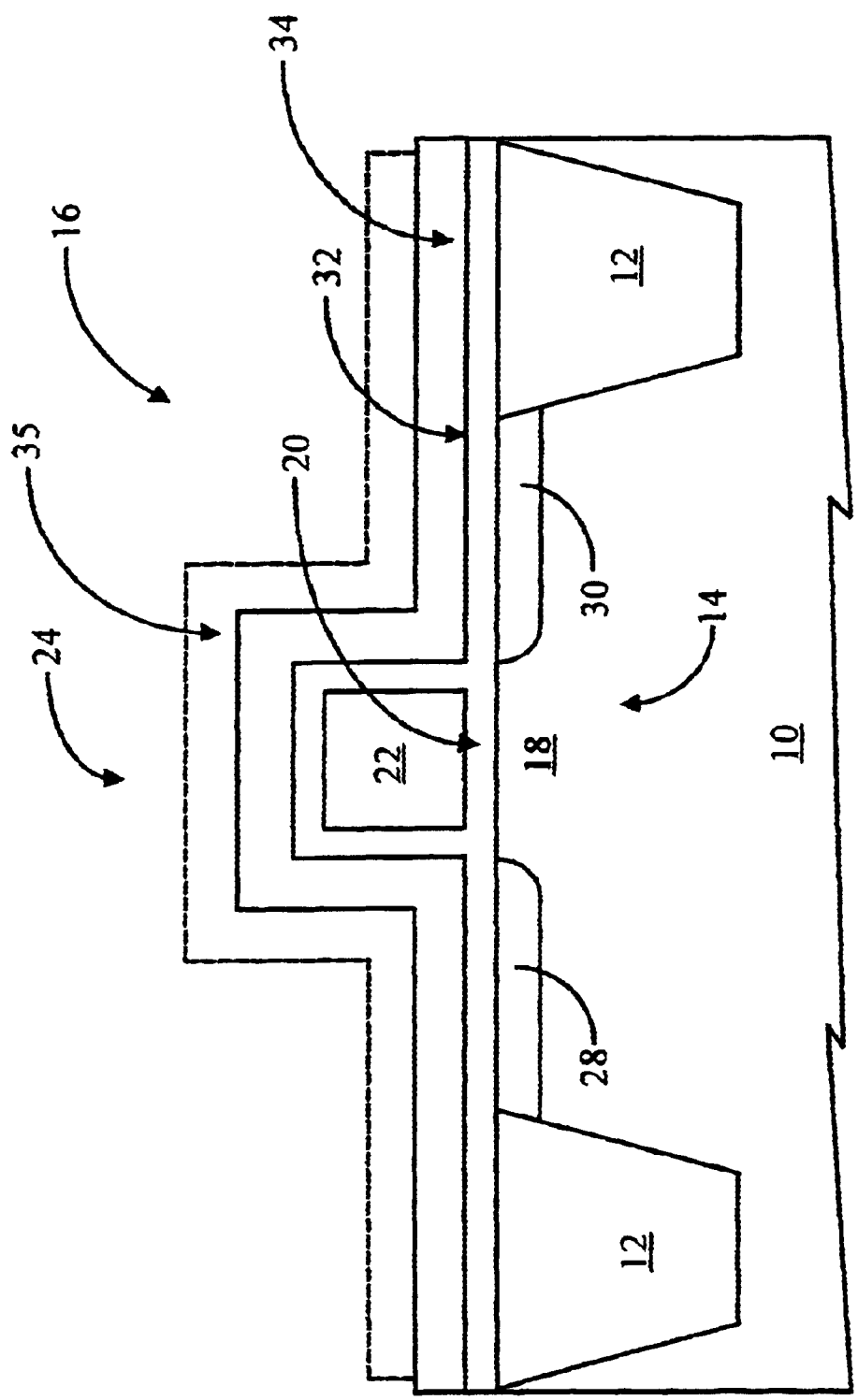

In FIG. 1B, the PAL 34 is formed over the substrate 10, in the exemplary embodiment of FIGS. 1A–1D, in contact with the barrier layer 32. The PAL 34 serves the following purposes. Specifically, the PAL 34 absorbs a portion 36 of the radiant energy 38 and conducts this energy to the source and drain regions 28, 30 by thermal conduction. The heat transfer takes place efficiently because the thickness of the barrier layer 32 is much less than the thermal diffusion length during the laser pulse. The PAL 34 also permits transmission of a portion 40 of the radiant energy 38 to the source and drain regions 28, 30 where it is absorbed. The two sources of energy, namely, the portions 36, 40, are thermally-conducted and transmitted, respectively, to the source and drain regions 28, 30 with sufficient fluence to melt such regions. Upon cooling after exposure to the portions 36, 40 of the radiant energy 38, the source and drain regions crystallize to form activated junctions between the source and drain regions 28, 30 and the channel region 18. On the other hand, the thickness of the field isolation regions 12 is usually much larger than the heat diffusion length. Therefore, the portion of the radiant energy 36 absorbed in the PAL 34 overlying the field isolation regions 12 is not sufficiently close to the bottom of the field isolation regions 12 to contribute significantly to heating in this area.

Accordingly, only the portion 40 from the radiant energy 38 incident to the PAL 34 reaches such region of the substrate. By design, this portion 40 of the radiant energy 38 is insufficient to melt the region of the substrate 10 underlying the field isolation regions 12. Likewise, thermal energy 42 generated by the portion 40 of the radiant energy 38 absorbed in the substrate 10 is generated at a location sufficiently distant from the overlying PAL 34 so that it has little contribution to the heating of the PAL. Only the portion of radiant energy directly absorbed in PAL 34 contributes to the heating of PAL, which, by design, is insufficient to cause ablation or surface damage. The PAL 40 also serves to prevent the gate region 24 from deforming under exposure to the radiant energy 38. The PAL 34 is formed desirably of a material that does not melt under exposure to the radiant energy 38 to act as a support structure for the gate region 24.

The PAL 34 is desirably designed to be optically thin, that is, less than three times the absorption length of the material composing the PAL, but sufficiently thick to attenuate the intensity of the radiant energy 38 so that the portion of the substrate 10 underneath the field isolation regions 12 will not be melted. The PAL 34 is formed over the barrier layer 32. The PAL 34 can be composed a metal, dielectric, or a doped spin-on glass, for example. To prevent ablation, peeling off, or cracking, the PAL 34 desirably has a high melting temperature (at least higher than silicon melting temperature), good adhesion to substrate 10 or the optional barrier layer 32, good step coverage over sloped regions of the integrated structure such as the sides of the gate region 24. In addition, the PAL 34 desirably has a relatively low thermal expansion coefficient and low built-in stress. Exemplary materials for the PAL 34 include titanium (Ti), titanium nitride (TiN), tantalum (Ta), and/or tantalum nitride (TaN), for example. The PAL 34 can be from ten (10) to hundreds (100s) of nanometers in thickness, for example. The thickness of the PAL 34 depends upon the absorption length of the material used to form such layer at the radiant energy wavelength used to anneal the source and drain regions 28, 30. In general, the PAL 34 is formed to a thickness sufficient to absorb from one (1) to ninety-five (95) percent of the incident radiant energy at the wavelength used. As a general guideline, favorable results can be obtained by targeting the PAL 34 to absorb one-third to two-thirds of the radiant energy 38, and to transmit the rest of such radiant energy to the substrate. In general, the thickness of the PAL 34 can be greater than one-hundredth (0.01) up to three (3) times its absorption length at the radiant energy wavelength used to expose the PAL. To absorb the maximum amount of radiant energy 38 in source/drain regions, the barrier layer 32 and the PAL 34 can be formed with a combined thickness that causes destructive interference of radiant energy reflecting from surfaces of the barrier layer 32 and the PAL 34 at the wavelength of such radiant energy. In other words, by forming the barrier layer 32 and PAL 34 so that their combined optical lengths are one-quarter (¼) of the wavelength of the radiant energy 38 or odd number of multiples thereof, total destructive interference of most of the radiant energy results. This desirably reduces the radiant energy necessary to melt silicon in active area, leading to less heating in trench isolation region and a reduced energy requirement on the radiant source.

In one exemplary configuration, the PAL 34 has been formed with ten (10) nanometers (nm) of titanium nitride (TiN) overlying ten (10) nm of titanium (Ti). At a radiant energy wavelength of three-hundred eight (308 nm), the absorption length of this composite PAL material is about 18 nm with a reflectance of around twenty-one percent (21%) of the incident radiant energy. The PAL 34 can be formed by sputtering deposition. An example of tool that can be used for sputtering deposition is the Endura™ PVD from Applied Materials, Santa Clara, Calif. Alternatively, the PAL 34 can be formed as a doped spin-on glass. Such spin-on glass can be obtained from numerous commercial sources. The techniques and equipment used to apply the spin-on glass to a substrate are also well-known.

A dielectric layer 35 (shown in broken line to indicate that such layer is optional) can be deposited on top of the PAL 34. This dielectric layer 35 serves two purposes: (1) such layer reinforces the mechanical strength of PAL 34 to better preserve the physical integrity of polysilicon gate layer 22 under exposure to the radiant energy used to anneal the integrated device; and (2) such layer adds extra thermal load to the field isolation area so that the surface temperature of PAL 34 in field isolation regions 12 can be further reduced to avoid undesirable surface damage or ablation of PAL 34.

The dielectric layer 35 should be transparent at the wavelength of the radiant energy to be used for annealing. The dielectric layer can be formed of silicon dioxide ($SiO_2$), silicon nitride ($Si_3N_4$), aluminum oxide ($Al_2O_3$), titanium oxide ($TiO_2$), barium strontium titanium oxide ($BaSrTiO_3$), and tantalum oxide ($Ta_2O_5$). The thickness of the dielectric layer 35 is preferably of the order of the thermal diffusion length of the material composing such layer, which is typically on the order of a few hundred nanometers. The thickness of the dielectric layer 35 can be made to minimize the surface reflectance from source 28 and drain 30 at the wavelength of radiant energy to be used to anneal the integrated device 16.

An exemplary dielectric layer 35 at a radiant energy wavelength of three-hundred eight (308) nanometers is formed of one-hundred-fifty (150) nanometers of silicon oxide ($SiO_2$) deposited using silane-based or TEOS (tetraethylorthosilicate)-based plasma-enhanced chemical vapor deposition (PECVD), as is well-known to persons of ordinary skill in this industry. The deposition temperature is preferably below four-hundred-fifty (450) degrees Celsius.

Figure 1C:
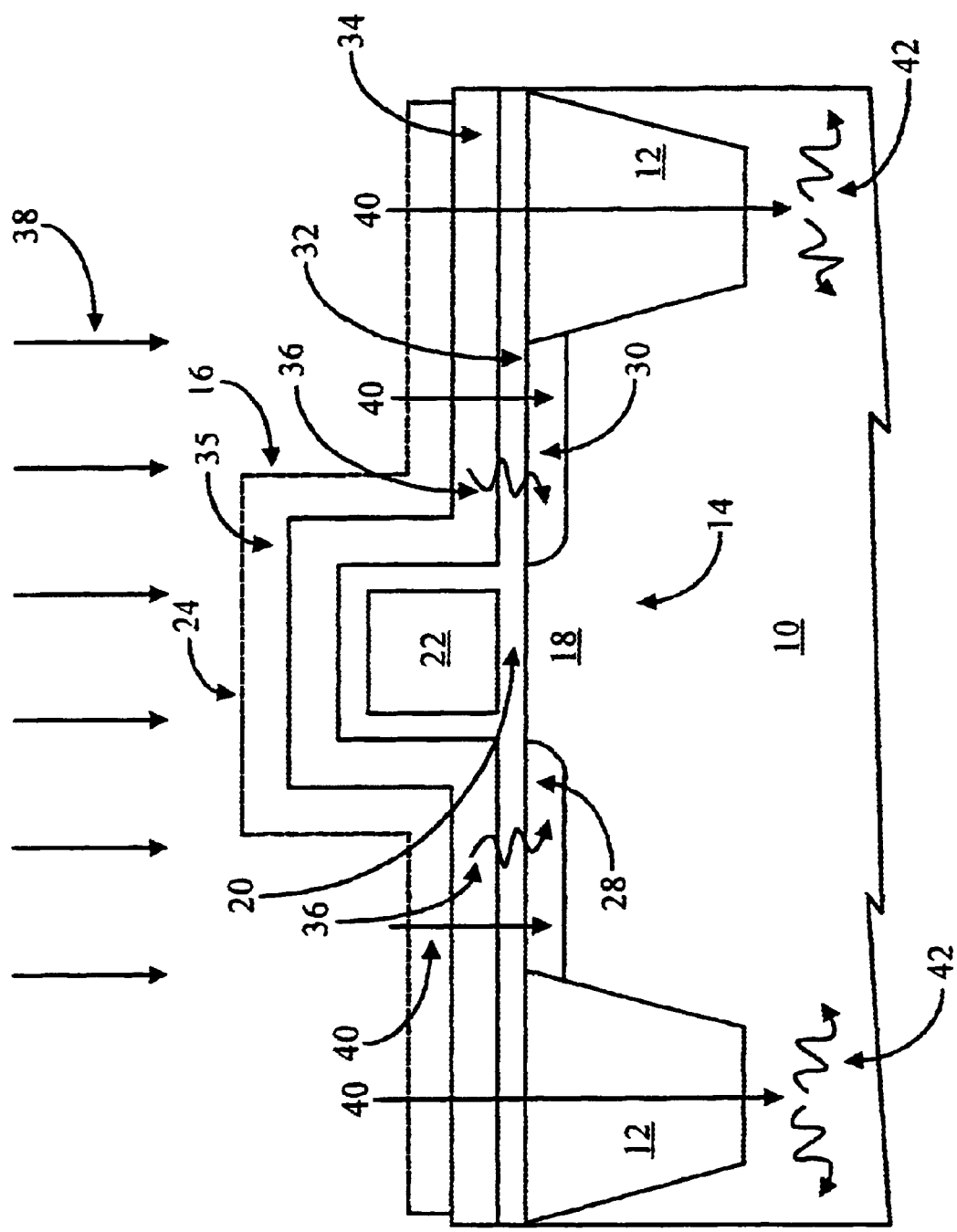

In FIG. 1C, the PAL 34 is exposed with the radiant energy 38. The fluence of the radiant energy 38 can be from five-hundredth (0.05) to one (1) Joules per square centimeter. The radiant energy 38 can have a wavelength from one-fifty-seven (157) to ten-thousand sixty-four (1,064) nanometers. The radiant energy 38 can be generated in a single pulse of energy or in a series of pulses. For example, the radiant energy 38 can be generated by a device such as a xenon chloride (XeCl) excimer laser operating at 308 nanometers (nm). Suitable lasers are commercially-available from numerous sources, including Lamda Physik™, Fort Lauderdale, Fla.

Figure 1D:
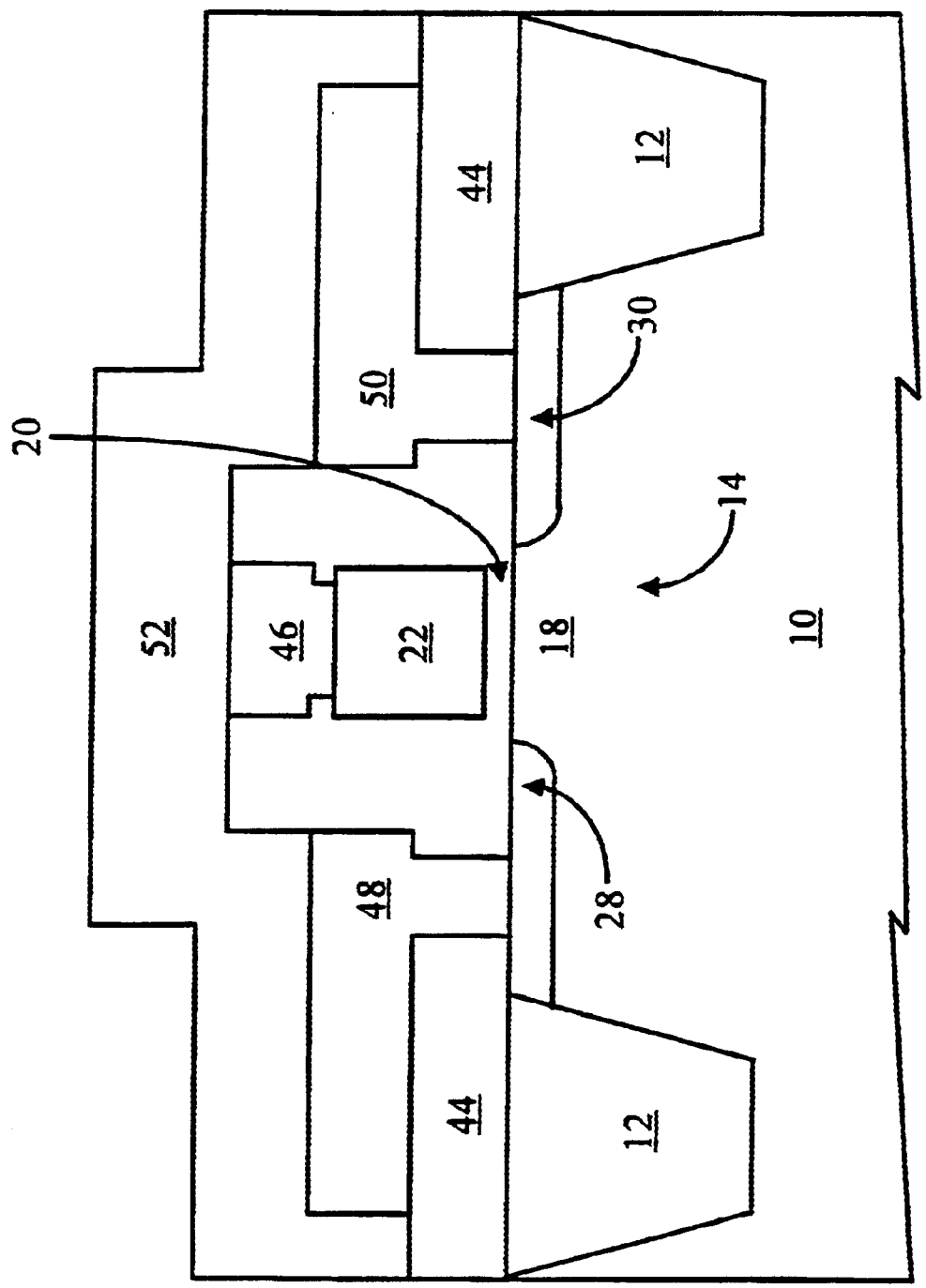

In FIG. 1D, the PAL 34 and the dielectric layer 35 if used, are removed from the substrate 10. The barrier layer 32 can be optionally removed and a new insulator layer 44 formed to take its place. Alternatively, the barrier layer 32 can be left in place or enhanced in thickness by deposition of additional insulation material such as silicon dioxide ($SiO_2$), to serve as the insulator layer 44 for the gate, source, and drain regions 24, 28, 30. Contact holes are selectively etched through layer 44 to the gate, source and drain regions 24, 30, 32 using a resist layer patterned to expose the contact areas, and an etchant to remove portions of the insulator layer to expose the gate, source, and drain regions of the substrate 10. A conductive layer such as a metal or metal alloy is deposited over the substrate and patterned using a resist layer to make conductive lines 46, 48, 50 contacting the gate, source, and drain regions 24, 30, 32, respectively, of the substrate 10. The metal or metal alloy layer can be composed of aluminum, copper, or alloys thereof. The conductive layer can be formed to a thickness of a few hundreds of nanometers or more, for example. Such layer can be formed by physical vapor deposition (PVD). An insulator layer 52 is formed over the patterned conductive lines 46, 48, 50 to passivate and protect the integrated device. The insulator layer 52 can be composed of silicon oxide ($SiO_2$) which can be doped with phosphorus to form "P-glass". The insulator layer 52 can also be composed of other dielectric sources such as silicon nitride ($Si_3N_4$), for example. The insulator layer 52 can be formed through plasma-enhanced chemical vapor deposition (PECVD) performed at a temperature of four-hundred-fifty (450) degrees Celsius or less.

Figure 2A:
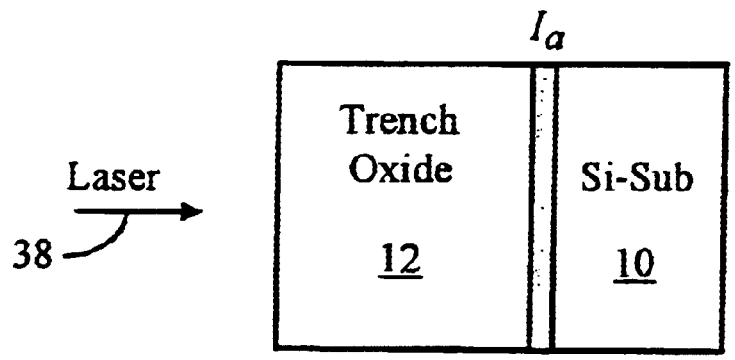
FIGS. 2A–2C are cross-sectional views of configurations in which no absorber layer, a full absorber layer, and a partial absorber layer, in accordance with the invention, are used over a substrate of a methods of the invention.
Figure 2B:
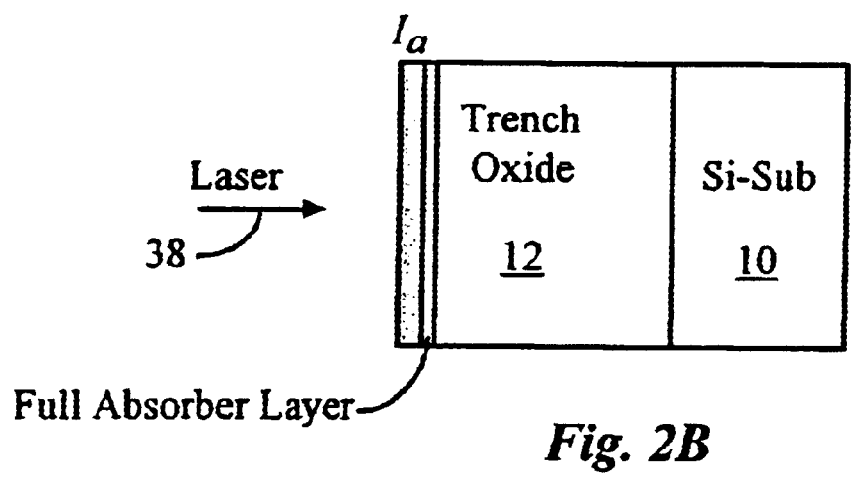
Figure 2C:
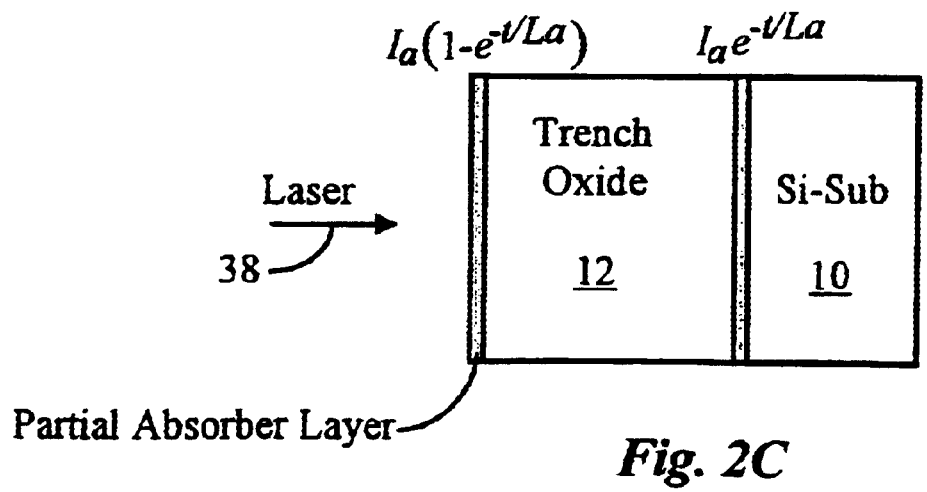

FIGS. 2A–2C are cross-sectional views of three different cases contrasting situations in which no absorber layer is used, a full absorber layer is used, and a partial absorber layer 34 is used in accordance with the invention. In the case of FIG. 2A, no absorber layer is used. The field isolation material is transparent to the radiant energy 38, hence all radiant energy is absorbed at the portion of the substrate 10 underneath the field isolation reg ion 12. In FIG. 2B, a full absorber layer is positioned over the field isolation region 12. All of the radiant energy 38 is absorbed near the surface of the full absorber. In FIG. 2C, a PAL 34 is formed over the field isolation region 12. The PAL 34 partially absorbs radiant energy 38 at the surface of the field isolation region 12 and partially transmits radiant energy that travels through the field isolation region 12 to heat the substrate 10. The amount of radiation absorbed at the PAL 34 is determined by $I_a(1-e^{-t/L_a})$, $I_a$ being the intensity of the radiant energy 38 at the surface of PAL 34, t being the thickness of the PAL in which $0.01 L_a < t < 3 L_a$, and $L_a$ being the absorption length of the material composing the PAL. The amount of radiation absorbed in the substrate 10 underneath field isolation region 12 is given by $I_a e^{-t/L_a}$. By varying t, the fraction of energy absorbed by PAL and the substrate can be adjusted.

Figure 3:
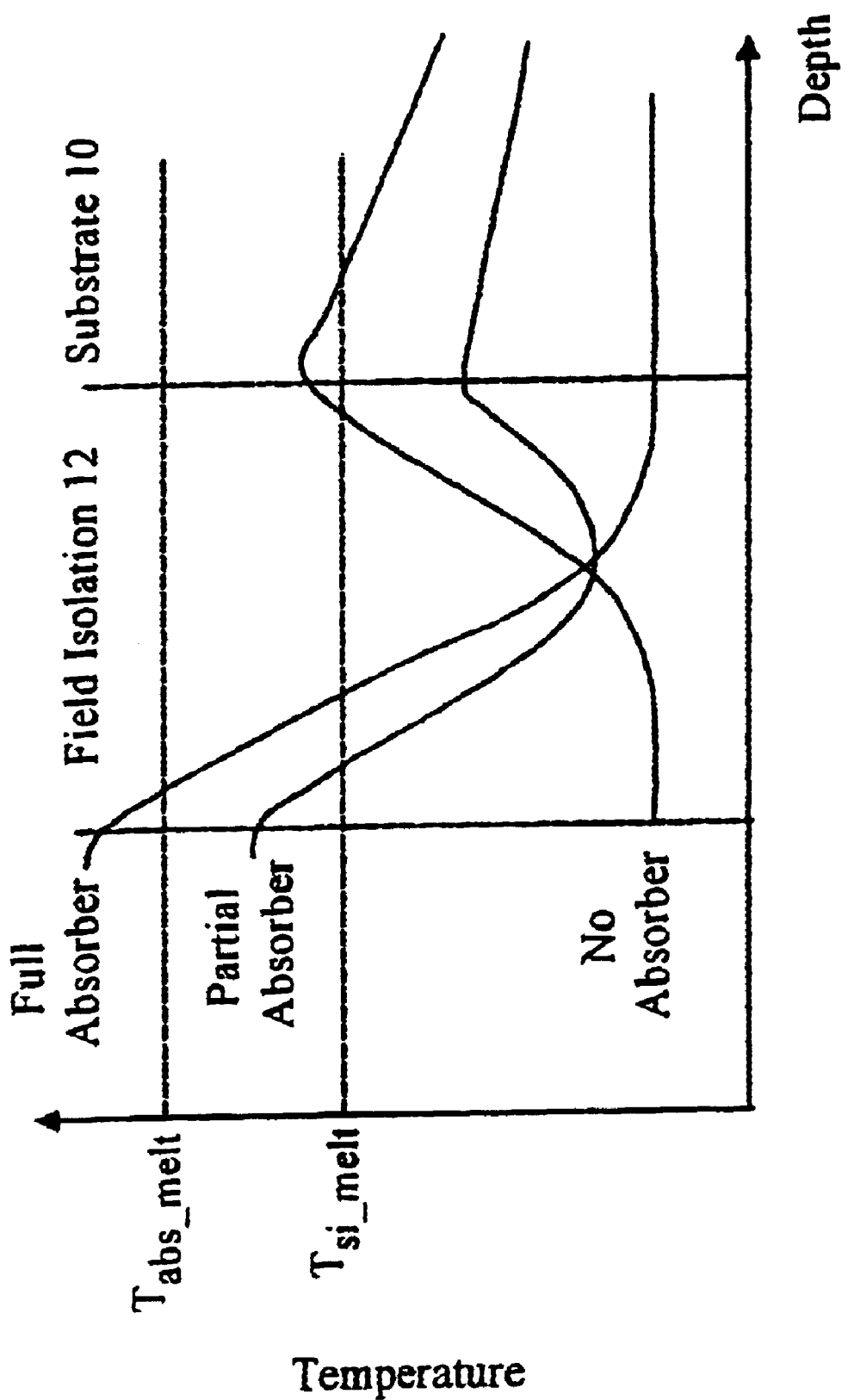
FIG. 3 is a graph of simulated temperature versus depth corresponding to the no absorber, full absorber, and partial absorber layer cases of respective FIGS. 2A–2C.

FIG. 3 is a graph of simulated temperature versus depth into the substrate 10 and/or the field isolation region 12 under radiant energy 38 for the three cases of FIGS. 3A–3C, respectively. With no absorber layer formed on the field isolation region 12, peak temperature occurs at substrate 10 immediately underneath the field isolation region. In this exemplary case, the peak temperature exceeds the silicon melting temperature $T_{si\_melt}$, indicating a portion of substrate 10 is undesirably melted. With the full absorber layer, peak temperature occurs at the surface of the absorber. In this case, the peak temperature exceeds the absorber melting temperature $T_{abs\_melt}$, indicating undesirable surface damage or ablation can take place. With the PAL 34, heating from the radiant energy 38 occurs at the surface of the PAL as well as at the substrate 10 underneath the field isolation region 12. Because of the split in heating energy, the temperature at both the PAL 34 and underneath the field isolation regions 12 can be controlled below their respective melting temperatures.

Although a specific method for making an integrated transistor 16 has been disclosed herein, it should be understood that numerous other techniques could be used to integrate the transistor. Thus, the method of making the integrated device 16 described in FIGS. 1A–1D is provided only to give a context for main focuses of the invention such as the PAL 34 and the optional barrier layer 32. It will be understood by those of ordinary skill in the art that such method can be applied with other methods to form integrated devices. In addition, it will be understood that other devices such as diodes, resistors, and capacitors, can be annealed with the method. The PAL 34 optionally with the barrier layer 32 can be used in other contexts, such as formation of integrated bi-polar transistors. Moreover, of course, the PAL 34 and the barrier layer 32 can be applied to form integrated complementary metal oxide semiconductor (CMOS) transistors by coupling two integrated devices as shown herein but having opposite channel conductivity types. In addition, although the PAL 34 has been shown in contact with the barrier layer 32, there is in general no requirement that they be contacting, and additional material layers could be present between the barrier layer 32 and the PAL 34. Further, the barrier layer 32 can be omitted altogether if the PAL 34 is of a species or material that has a thermal diffusion length sufficiently low to avoid contamination of the source and drain regions 28, 30. All such features are intended to be within the scope of the invention as claimed.

The many features and advantages of the present invention are apparent from the detailed specification and thus, it is intended by the appended claims to cover all such features and advantages of the described methods and article produced thereby which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed is:

1. A method comprising the steps of:
   a) forming a partial absorber layer (PAL) over at least one integrated transistor device formed on a semiconductor substrate; and
   b) exposing the PAL to radiant energy with the PAL absorbing one-third to two-thirds of the radiant energy and the reminder of the radiant energy being transmitted to the substrate through the PAL.

2. A method as claimed in claim 1 wherein the radiant energy transmitted through the PAL is absorbed in the source and drain regions adjacent a gate region of the integrated transistor device and in the semiconductor substrate underneath field isolation regions of the integrated device.

3. A method as claimed in claim 2 wherein the radiant energy absorbed by the PAL is thermally conducted from the PAL to the source and drain regions.

4. A method as claimed in claim 3 wherein the combination of the radiant energy transmitted through, thermally conducted from, the PAL are sufficient to melt the source and drain regions to anneal the junctions of the integrated device.

5. A method as claimed in claim 3 wherein the radiant energy transmitted through the PAL traveling to the substrate underneath the field isolation regions is insufficient in fluence to melt the substrate, and the radiant energy absorbed by the PAL over the field isolation regions is insufficient to cause ablation or surface damage to the PAL.

6. A method as claimed in claim 3 wherein the PAL is formed to be greater than one-hundredth (0.01) but less than three (3) times the absorption length of the material composing the PAL at the wavelength of the radiant energy.

7. A method as claimed in claim 1 wherein the PAL is composed of at least one of titanium (Ti), titanium nitride (TiN), tantalum (Ta), and tantalum nitride (TaN).

8. A method as claimed in claim 1 wherein the step (a) includes:

a1) forming a titanium (Ti) layer over the substrate; and a2) forming a titanium nitride (TiN) layer over the titanium layer.

9. A method as claimed in claim 8 wherein the titanium layer is formed with a thickness from five (5) to twenty (20) nanometers, and the titanium nitride layer is formed with a thickness of from five (5) to twenty (20) nanometers.

10. A method as claimed in claim 1 wherein the PAL is composed of doped spin-on glass.

11. A method as claimed in claim 1 wherein the PAL has a stress of less than $5\ e^9$ dynes per square centimeter.

12. A method as claimed in claim 1 wherein the PAL is formed by physical vapor deposition (PVD).

13. A method as claimed in claim 1 wherein the radiant energy used in the exposing of the step (b) is performed with radiant energy from a laser.

14. A method as claimed in claim 1 wherein the radiant energy has a fluence from five-hundredth (0.05) to one (1) Joule per square centimeter at a wavelength from one-hundred-fifty-seven (157) to ten-thousand-sixty-four (1,064) nanometers.

15. A method as claimed in claim 1 further comprising the step of:

c) forming a barrier layer over the substrate, the barrier layer situated between the substrate and the PAL, the barrier layer preventing contamination of the substrate by blocking diffusion of material from the PAL into the substrate in the performance of the exposure of the step (b).

16. A method as claimed in claim 15 wherein the barrier layer is composed of silicon dioxide ($SiO_2$).

17. A method as claimed in claim 15 wherein the silicon dioxide ($SiO_2$) the barrier layer is formed to a thickness of ten (10) to twenty (20) nanometers.

18. A method as claimed in claim 15 wherein the barrier layer is formed using low temperature oxidation (LTO).

19. A method as claimed in claim 15 wherein the barrier layer is formed using plasma-enhanced chemical vapor deposition (PECVD).

20. A method as claimed in claim 15 wherein deposition temperature for forming the barrier layer and the PAL is less than four-hundred-fifty (450) degrees Celsius.

21. A method as claimed in claim 1 further comprising the step of:

c) forming a dielectric layer over the PAL, the dielectric layer reinforcing the mechanical strength of PAL under exposure to the radiant energy in the step (b) to preserve the physical integrity of a polysilicon gate layer of the integrated transistor device.

22. A method as claimed in claim 21 wherein the dielectric layer adds thermal load to the field isolation region so that the surface temperature of the PAL in field isolation region can be further reduced to avoid damage or ablation of the PAL.

* * * * *